(12) United States Patent
Sugimoto et al.

(10) Patent No.: US 10,943,077 B2
(45) Date of Patent: *Mar. 9, 2021

(54) TAG BOARD, RFID TAG, AND RFID SYSTEM

(71) Applicant: KYOCERA Corporation, Kyoto (JP)

(72) Inventors: Yoshimasa Sugimoto, Kirishima (JP); Shuuichi Yamamoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,872

(22) Filed: Mar. 23, 2018

(65) Prior Publication Data

US 2018/0218182 A1 Aug. 2, 2018

Related U.S. Application Data

(63) Continuation of application No. PCT/JP2017/037862, filed on Oct. 19, 2017.

(30) Foreign Application Priority Data

Oct. 21, 2016 (JP) .................................. 2016-207009

(51) Int. Cl.
| | |
|---|---|
| *G06K 7/10* | (2006.01) |
| *G06K 19/077* | (2006.01) |
| *H05K 1/18* | (2006.01) |
| *H01Q 9/04* | (2006.01) |
| *H01Q 1/22* | (2006.01) |

(Continued)

(52) U.S. Cl.
CPC ... *G06K 7/10326* (2013.01); *G06K 19/07749* (2013.01); *G06K 19/07773* (2013.01); *H01Q 1/2225* (2013.01); *H01Q 9/0421* (2013.01); *H05K 1/183* (2013.01); *H01Q 1/2283* (2013.01);

(Continued)

(58) Field of Classification Search
CPC ....... G06K 19/07749; G06K 19/07773; G06K 7/10326; H01Q 1/2225; H01Q 9/0421
See application file for complete search history.

(56) References Cited

U.S. PATENT DOCUMENTS

| | | | | |
|---|---|---|---|---|
| 6,111,544 A | * | 8/2000 | Dakeya | H01Q 1/243 343/700 MS |
| 6,535,090 B1 | * | 3/2003 | Matsuzuka | H01P 5/187 333/125 |

(Continued)

FOREIGN PATENT DOCUMENTS

| | | |
|---|---|---|
| CN | 101351816 A | 1/2009 |
| CN | 104377433 A | 2/2015 |
| JP | 2000-101335 A | 4/2004 |

*Primary Examiner* — Daniel I Walsh
(74) *Attorney, Agent, or Firm* — Volpe Koenig

(57) ABSTRACT

A tag board includes an insulation substrate with a lower surface bonded to the outside and an upper surface including a recess, an upper surface conductor on the upper surface of the insulation substrate, a ground conductor on the lower surface of the insulation substrate, and a short-circuit-portion through conductor that penetrates the insulation substrate in the thickness direction and electrically connects the upper surface conductor and the ground conductor to each other. The short-circuit-portion through conductor is connected to the upper surface conductor only at a part of the periphery of the upper surface conductor.

14 Claims, 9 Drawing Sheets

(51) Int. Cl.
*H05K 1/02* (2006.01)
*H01Q 1/52* (2006.01)

(52) U.S. Cl.
CPC ............ *H01Q 1/52* (2013.01); *H05K 1/0231* (2013.01); *H05K 2201/10098* (2013.01)

(56) References Cited

U.S. PATENT DOCUMENTS

| | | | | |
|---|---|---|---|---|
| 8,188,931 | B2* | 5/2012 | Furutani | G06K 19/07749 343/700 MS |
| 8,576,124 | B2* | 11/2013 | Popugaev | G06K 19/07749 343/700 MS |
| 10,089,573 | B2* | 10/2018 | Sugimura | G06K 19/077 |
| 10,157,297 | B2* | 12/2018 | Sugimoto | G06K 7/10366 |
| 10,205,239 | B1* | 2/2019 | Contopanagos | H02J 50/005 |
| 10,552,724 | B2* | 2/2020 | Kato | G06K 19/0723 |
| 10,734,703 | B2* | 8/2020 | Bartlett | H01Q 1/1207 |
| 2003/0137046 | A1* | 7/2003 | Kageyama | H01L 21/4867 257/704 |
| 2004/0085244 | A1* | 5/2004 | Kadambi | H01Q 9/0421 343/700 MS |
| 2004/0125578 | A1* | 7/2004 | Konishi | H01L 23/3121 361/783 |
| 2004/0171404 | A1* | 9/2004 | Annamaa | H01Q 1/243 455/550.1 |
| 2004/0252062 | A1* | 12/2004 | Tracy | H01Q 1/243 343/702 |
| 2005/0088260 | A1* | 4/2005 | Ajioka | H01L 23/66 333/247 |
| 2006/0033667 | A1* | 2/2006 | Johnson | H01Q 1/243 343/702 |
| 2006/0145927 | A1* | 7/2006 | Choi | H01Q 1/22 343/700 MS |
| 2007/0008221 | A1* | 1/2007 | Tseng | H01Q 1/38 343/700 MS |
| 2007/0023888 | A1* | 2/2007 | Fujii | H01L 23/3114 257/698 |
| 2007/0096992 | A1* | 5/2007 | Fujii | H01Q 9/0414 343/700 MS |
| 2007/0176827 | A1* | 8/2007 | Itoh | H01Q 21/08 343/700 MS |
| 2008/0143608 | A1* | 6/2008 | Watanabe | H01Q 9/0421 343/700 MS |
| 2009/0102728 | A1* | 4/2009 | Gamand | H01Q 1/38 343/702 |
| 2009/0166811 | A1* | 7/2009 | Fujii | H01L 24/94 257/621 |
| 2009/0207080 | A1* | 8/2009 | Floyd | H01Q 1/38 343/700 MS |
| 2009/0224056 | A1 | 9/2009 | Kwon | |
| 2010/0065647 | A1* | 3/2010 | Ritamaki | G06K 19/041 235/492 |
| 2010/0188306 | A1* | 7/2010 | Kitayoshi | H01Q 13/18 343/767 |
| 2010/0253583 | A1* | 10/2010 | Furutani | H01Q 9/0407 343/702 |
| 2011/0025471 | A1* | 2/2011 | Popugaev | H01Q 1/2208 340/10.3 |
| 2011/0226860 | A1* | 9/2011 | Fan | G06K 19/07749 235/492 |
| 2011/0315774 | A1* | 12/2011 | Baba | G06K 19/0772 235/488 |
| 2013/0078932 | A1* | 3/2013 | Asrani | H01Q 1/243 455/90.3 |
| 2013/0292808 | A1* | 11/2013 | Yen | H01L 23/552 257/660 |
| 2015/0048995 | A1 | 2/2015 | Andrenko | |
| 2016/0240492 | A1* | 8/2016 | Wolter | H01L 23/552 |
| 2017/0016773 | A1* | 1/2017 | Arai | G01K 1/02 |
| 2018/0032853 | A1* | 2/2018 | Sugimura | H01Q 9/0421 |
| 2018/0268178 | A1* | 9/2018 | Sugimoto | H01Q 1/2283 |

\* cited by examiner

TAG BOARD, RFID TAG, AND RFID SYSTEM

TECHNICAL FIELD

The present disclosure relates to a tag board having an upper surface conductor as a radiation conductor (an antenna conductor), a radio frequency identification (RFID) tag, and an RFID system.

BACKGROUND ART

Detecting and managing information on various commodities by using RFID tags mounted on the commodities has been widely performed. Examples of the RFID tags include an RFID tag including an antenna conductor for transmitting and receiving information by using radio waves in, for example, an ultra-high frequency (UHF) band and a semiconductor device such as an integrated circuit (IC). For example, an RFID tag is configured to include a tag board with an upper surface conductor as an antenna conductor disposed on an insulation substrate and a feeder disposed on the tag board and electrically connected to the upper surface conductor. The RFID tag is mounted on (bonded to, for example) a commodity via various bonding materials.

Information is transmitted and received between the antenna conductor of the RFID tag and an external device such as a reader/writer having a radio wave transmitting/receiving function. The transmitted and received signal is stored or read out by the semiconductor device. The semiconductor device also functions as a feeder for the antenna conductor (refer to Patent Literature 1).

CITATION LIST

Patent Literature

PTL 1: Japanese Unexamined Patent Application Publication No. 2000-101335

SUMMARY OF INVENTION

A tag board in an aspect of the present disclosure includes: an insulation substrate with a lower surface bonded to the outside and an upper surface including a recess; an upper surface conductor disposed on the upper surface of the insulation substrate; a ground conductor on the lower surface of the insulation substrate; and a short-circuit-portion through conductor that penetrates the insulation substrate in the thickness direction and electrically connects the upper surface conductor and the ground conductor to each other. The short-circuit-portion through conductor is connected to the upper surface conductor only at a part of the periphery of the upper surface conductor.

An RFID tag in an aspect of the present disclosure includes the tag board configured as described above, and a feeder in the recess. The feeder includes a first electrode electrically connected to the upper surface conductor and a second electrode electrically connected to the upper surface conductor.

An RFID system in an aspect of the present disclosure includes the RFID tag configured as described above, and a reader/writer having an antenna for transmitting and receiving a radio wave between the reader/writer and the upper surface conductor of the RFID tag.

DESCRIPTION OF EMBODIMENTS

A tag board, an RFID tag, and an RFID system in an embodiment of the present disclosure will be described with reference to the accompanying drawings. The top and bottom in the following are determined only for convenience in description and do not limit the top and bottom when the tag board, the RFID tag, or the RFID system is actually used.

Figure 1A:
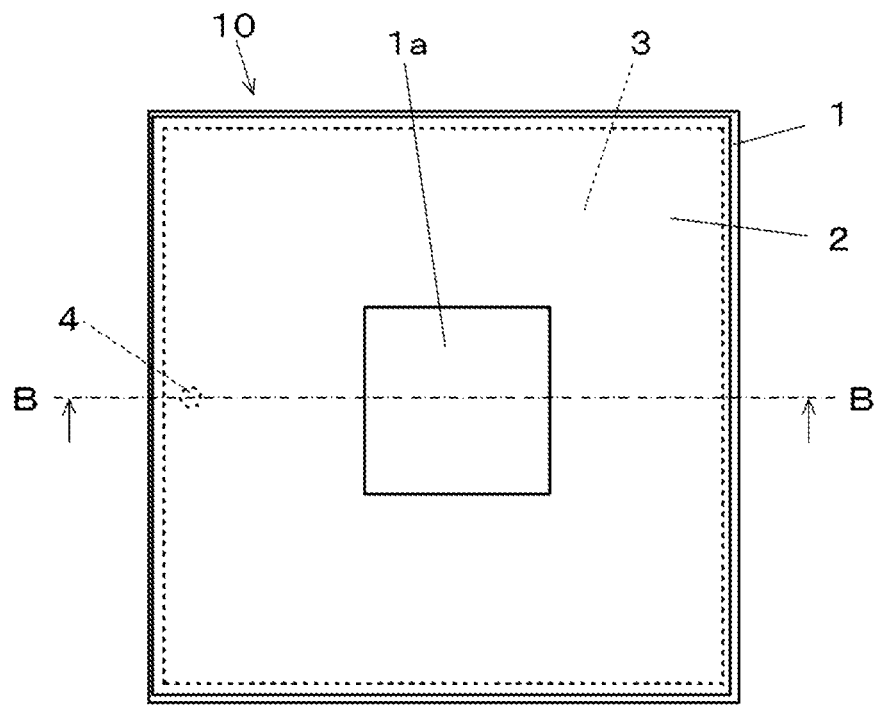
FIG. 1A is a plan view illustrating an example of a tag board in an embodiment of the present disclosure.
Figure 1B:
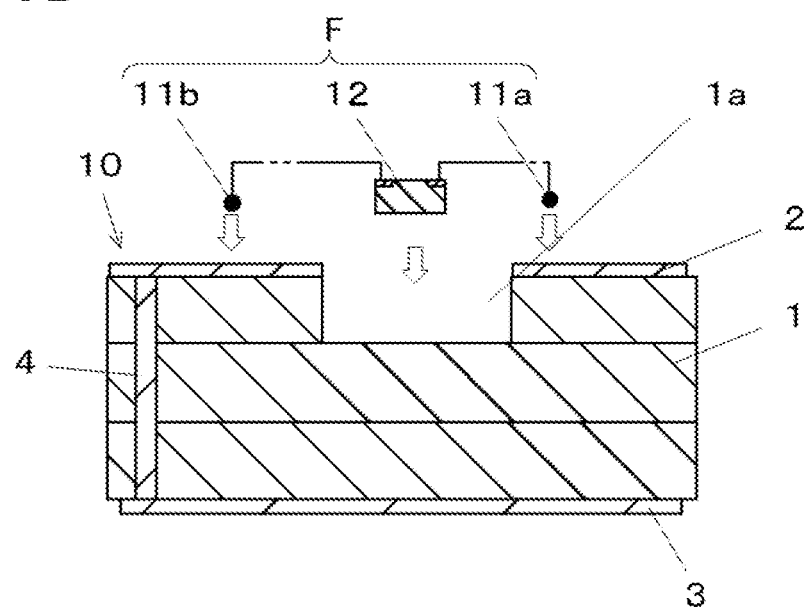
FIG. 1B is a sectional view taken along a line B-B in FIG. 1A.
Figure 2A:
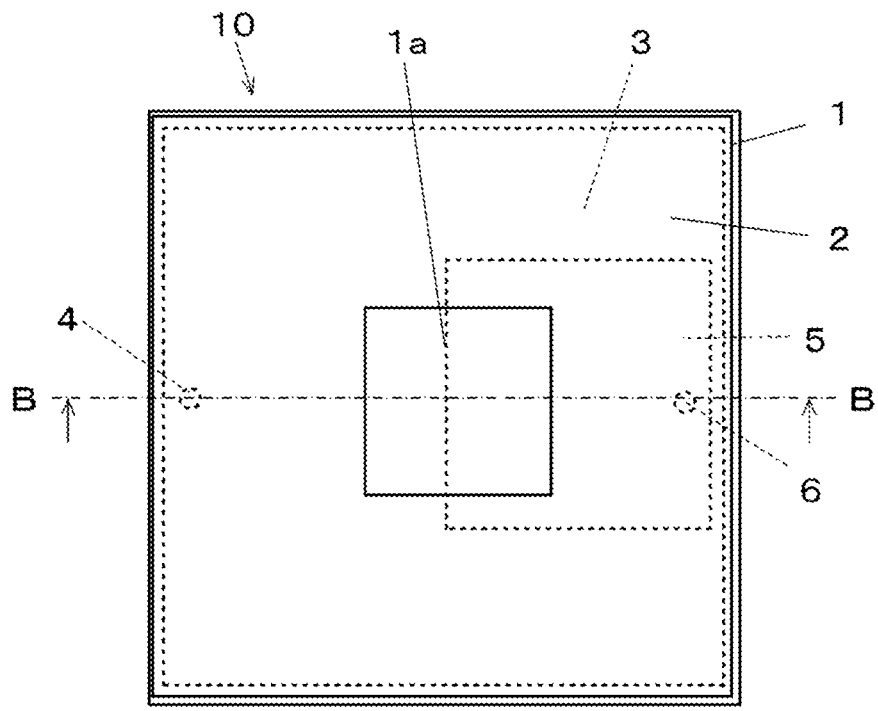
FIG. 2A is a plan view illustrating a modification example of the tag board illustrated in FIGS. 1A and 1B.
Figure 2B:
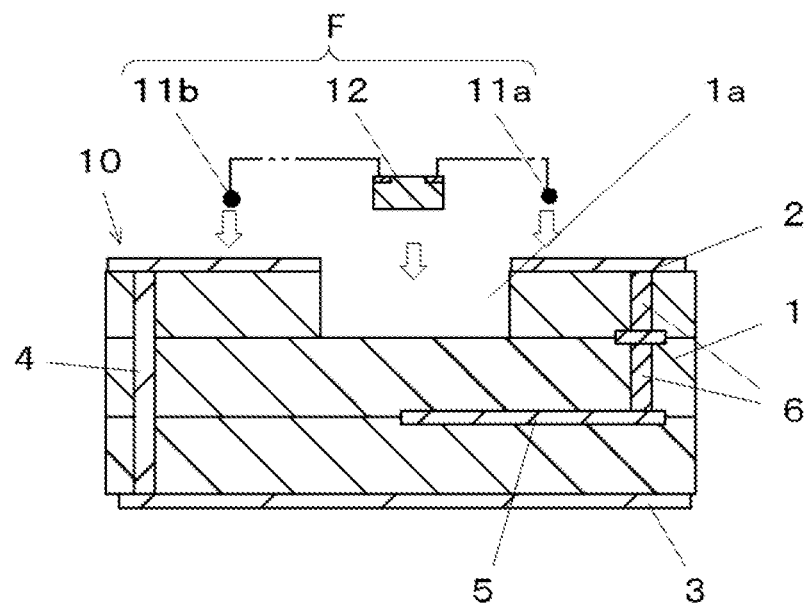
FIG. 2B is a sectional view taken along the line B-B in FIG. 1A.
Figure 3:
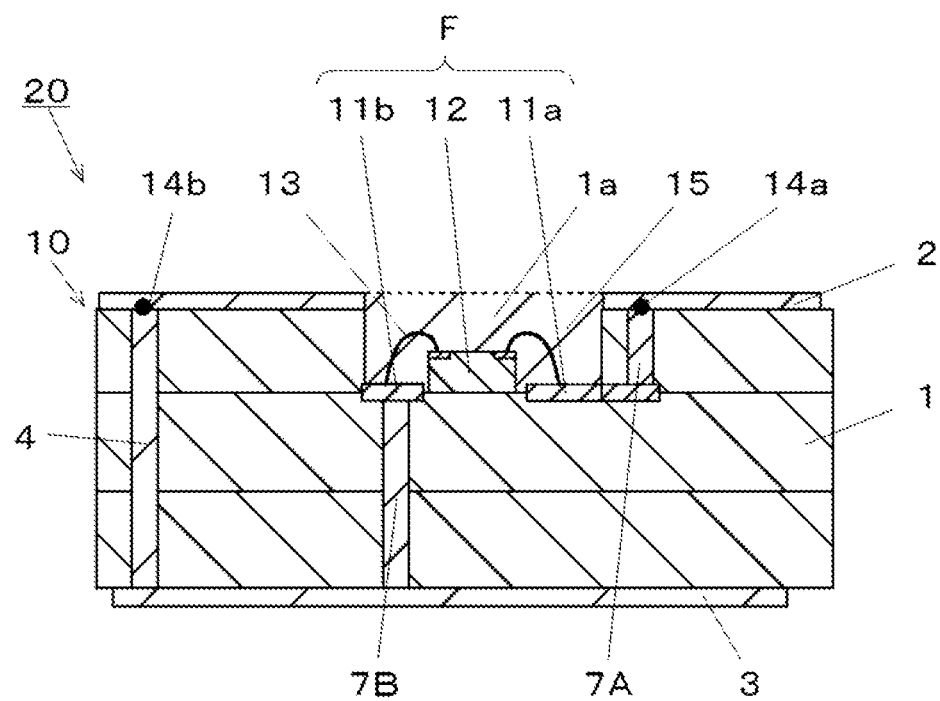
FIG. 3 is a sectional view illustrating an example of an RFID tag in the embodiment of the present disclosure.
Figure 4:
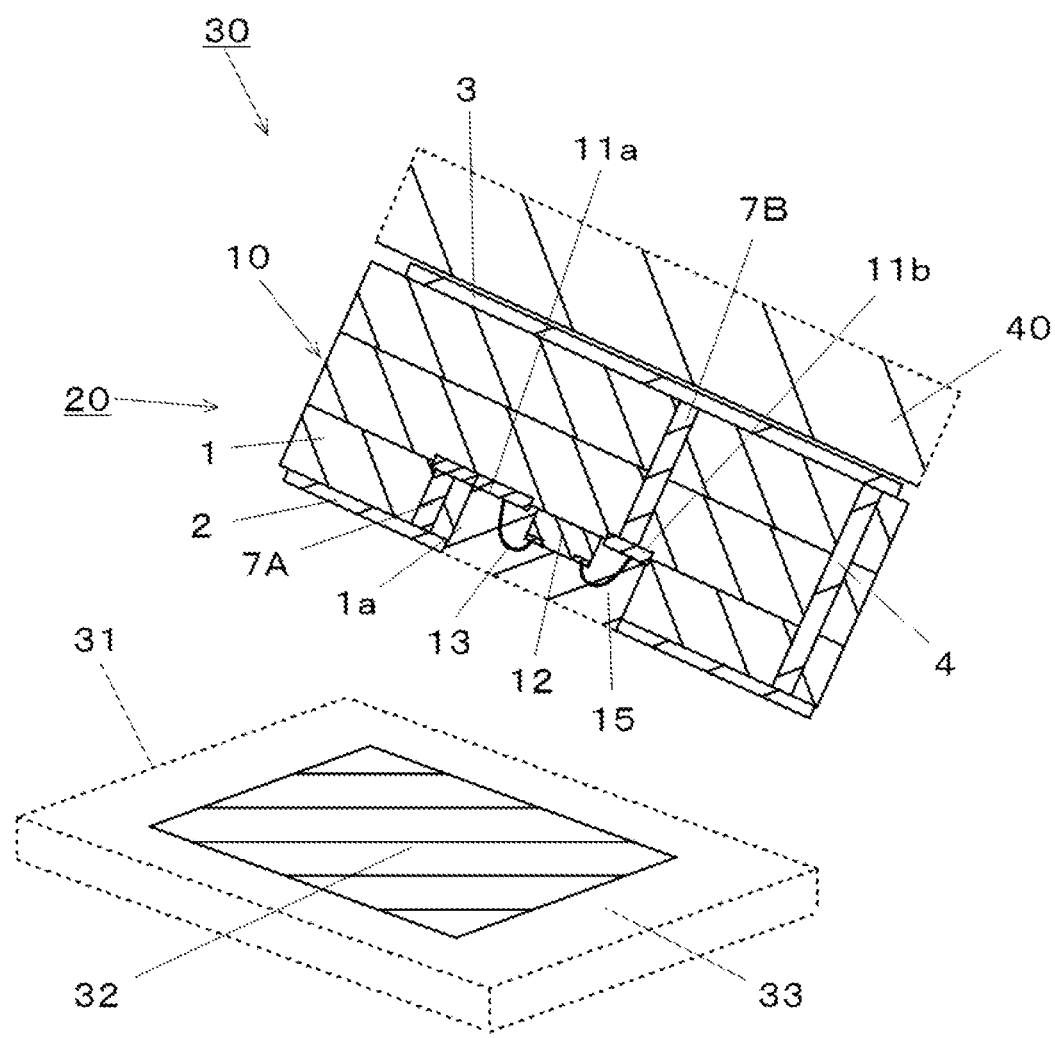
FIG. 4 is a schematic diagram illustrating an example of an RFID system in the embodiment of the present disclosure.

FIG. 1A is a plan view illustrating an example of a tag board in the embodiment of the present disclosure, and FIG. 1B is a sectional view taken along a line B-B in FIG. 1A. FIG. 2A is a plan view illustrating a modification example of the tag board illustrated in FIGS. 1A and 1B, and FIG. 2B is a sectional view taken along the line B-B in FIG. 2A. FIG. 3 is a sectional view illustrating an example of an RFID tag in the embodiment of the present disclosure and includes the tag board illustrated in FIGS. 1A and 1B. FIG. 4 is a schematic diagram of the RFID system in the embodiment of the present disclosure, and includes a sectional view of the RFID tag illustrated in FIG. 3 and a perspective view of a reader/writer.

In a tag board in the related art, in order to use the tag board as an RFID tag, when a semiconductor device is electrically connected to a power supply terminal as a feeder, it is necessary to mount the semiconductor device on the outer surface of the tag board. Therefore, it is difficult to increase the reliability of the junction of the semiconductor device. That is, it is difficult to manufacture a highly reliable RFID tag. In contrast, for example, it is conceivable to dispose a recess in the tag board, locate the feeder in the recess, and mount the RFID tag by blocking the recess with a surface of a commodity.

However, if such a recess is disposed, there is a possibility that a resonance frequency of the RFID tag deviates from a predetermined range due to the existence of a recess. When the resonance frequency deviates, there is a possibility that the communication distance of the RFID tag may be reduced.

The tag board including an upper surface conductor as an antenna conductor and a ground conductor which are disposed to face each other across a dielectric insulation substrate is used. When the recess is disposed on the lower surface of the tag board which is a mounting surface to a commodity, the ground conductor disposed on the lower surface has a shape with an opening at a portion of the recess. As described above, the RFID tag is mounted to block the recess with the surface of the commodity, that is, for example, the RFID tag is used by causing the lower surface of the RFID tag to contact with the surface of a metal commodity or by bonding the lower surface of the RFID tag to the surface of the metal commodity using a bonding material. Accordingly, a distance between the upper surface conductor and a layer (the ground conductor or the surface of the commodity) opposed thereto having a ground potential at a portion where the recess exists is different from a distance between the upper surface conductor and the layer opposed thereto at a portion where the recess does not exist. Specifically, at the portion where the recess exists, since the ground conductor does not exist on the lower surface of the insulation substrate, the distance between the upper surface conductor and the layer having the ground potential increases. The deviation of the resonance frequency described above is due to such a variation in the distance between the upper surface conductor and the layer having the ground potential.

(Tag Board)

A tag board 10 in the embodiment includes an insulation substrate 1 with an upper surface and a lower surface, an upper surface conductor 2 disposed on the upper surface of the insulation substrate 1, a ground conductor 3 disposed on the lower surface of the insulation substrate 1. The lower surface of the insulation substrate 1 is bonded to the outside (commodity or the like to be described later). The upper surface of the insulation substrate 1 includes a recess 1a. The tag board 10 further includes a short-circuit-portion through conductor 4 penetrating the insulation substrate 1 in the thickness direction. The short-circuit-portion through conductor electrically connects the upper surface conductor 2 and the ground conductor 3. The short-circuit-portion through conductor 4 is connected to the upper surface conductor 2 only at a part of the periphery of the upper surface conductor 2.

For example, as in the example illustrated in FIG. 1A to FIG. 2B, a first electrode 11a and a second electrode 11b are disposed on the tag board 10, and the electrodes are electrically connected to the upper surface conductor 2, and thus, the RFID tag is manufactured. The first electrode 11a and the second electrode 11b are, for example, wiring conductors (reference sign is not given to the wiring conductors) which are electrically connected to the semiconductor device 12 in the recess 1a. Similarly to the upper surface conductor 2 and the like, the first electrode 11a and the second electrode 11b may be integrally formed with the insulation substrate 1 in advance, or may be separately bonded using a bonding material or the like. The first electrode 11a, the second electrode 11b, and the semiconductor device 12 configures a feeder F in the RFID tag 20.

In the example illustrated in FIG. 1A to FIG. 2B, the connection of the first electrode 11a and the second electrode 11b to the upper surface conductor 2 is schematically illustrated by an imaginary line (a two-dot chain line). Details of the electrical connection will be described later.

According to the tag board in an aspect of the present disclosure, the deviation of the resonance frequency can be effectively reduced. That is, according to the tag board having such configuration, since a recess is disposed on the upper surface, when an RFID tag including the tag board is mounted on the commodity, it is possible to reduce the possibility that the distance between the upper surface conductor as the antenna conductor and the layer (the ground conductor or the surface of the commodity) opposed thereto having a ground potential at the portion where the recess exists is different from the distance between the upper surface conductor and the layer opposed thereto at the portion where the recess does not exist. As described above, the deviation of the resonance frequency is caused by such a variation in the distance between the upper surface conductor and the layer having the ground potential, and thus, the deviation of the resonance frequency can be suppressed by reducing the variation of the distance. Therefore, with the tag board having such configuration, it is possible to easily manufacture the RFID tag capable of suppressing the deviation of the resonance frequency.

The insulation substrate 1 functions as an electrically insulating substrate for arranging the conductor portions such as the upper surface conductor 2 and the ground conductor 3 while electrically insulating the conductor portions from each other. The insulation substrate 1 also functions as a substrate for mounting and fixing members such as the semiconductor device 12 described later.

The insulation substrate 1 has a quadrangular plate shape such as a square shape. The insulation substrate 1 includes the recess 1a at a predetermined portion such as a center portion of the upper surface. As described above, the recess 1a is a portion in which the semiconductor device 12 configuring the feeder F is disposed, and the semiconductor device 12 is fixed to a bottom surface of the recess 1a. The semiconductor device 12 is fixed to the bottom surface of the recess 1a by a bonding method using a bonding material (not illustrated) such as a low melting point brazing filter material such as a gold-silicon solder, a glass composite material or a resin adhesive.

The insulation substrate 1 is formed of an aluminum oxide sintered body, an aluminum nitride sintered body, a ceramic sintered body such as a mullite sintered body or a glass ceramic sintered body. If the insulation substrate 1 is made of, for example, the aluminum oxide sintered body, the insulation substrate 1 is manufactured as follows. First, raw material powder such as aluminum oxide and silicon oxide are molded into a sheet shape together with an appropriate organic binder and an organic solvent, and a plurality of ceramic green sheets each having a rectangular sheet shape is made. Next, a laminate is made by laminating the ceramic green sheets. Thereafter, the laminate is burned at a temperature of 1300 to 1600° C. to manufacture the insulation substrate 1.

In the tag board in the embodiment, a plurality of insulation layers (reference sign is not given) formed by burning the ceramic green sheets is laminated to each other, and forms the insulation substrate 1.

If the center portion or the like of some of the ceramic green sheets are punched out in the thickness direction and processed into a frame shape and the frame-shaped ceramic green sheets are laminated on the uppermost layer and burned, the insulation substrate 1 including the recess 1a can be made. The insulation substrate 1 is a laminate in which a plurality of insulation layers formed by sintering the respective ceramic green sheets is laminated.

The conductor portions such as the upper surface conductor 2 and the ground conductor 3 are portions that function as an antenna (reference sign is not given) when the tag board 10 is used as the RFID tag 20. This antenna includes the upper surface conductor 2 and the ground conductor 3, and a short-circuit-portion through conductor 4 that electrically connects the above-described conductors, and configures an antenna conductor (an inverted-F antenna) that transmits and receives radio waves between the antenna and an antenna 32 of the reader/writer 31 described below. The inverted-F antenna is an antenna based on a patch antenna, and is suitable for RFID tag because the inverted-F antenna can be directly attached to the metal commodity and can be made smaller than the patch antenna.

The upper surface conductor 2 is an antenna conductor that can actually transmit and receive the radio waves, and is formed as a square frame-shaped conductor layer. Because the recess 1*a* is disposed on the upper surface of the insulation substrate 1, the upper surface conductor 2 is not disposed at the portion of the recess 1*a*. Therefore, the upper surface conductor 2 has a frame shape in plan view.

The upper surface conductor 2 itself is an antenna conductor, and an upper end portion of the short-circuit-portion through conductor 4 is connected to an end portion (a periphery close to the center portion of one of the sides of the upper surface conductor 2 in the example illustrated in FIG. 2B) of the square frame-shaped antenna conductor. That is, the short-circuit-portion through conductor 4 is connected to the upper surface conductor 2 at only a part of the periphery of the upper surface conductor 2. As described above, since the short-circuit-portion through conductor 4 is connected to the upper surface conductor 2 at a location close to the periphery of the upper surface conductor 2 instead of the center portion thereof, it is possible to configure, together with the ground conductor 3, the antenna conductor that effectively functions as an inverted-F antenna.

In the example illustrated in FIG. 1A to FIG. 2B, the short-circuit-portion through conductor 4 is configured with only one through conductor, but it may be configured with a plurality of through conductors (not illustrated). These through conductors, for example, are arranged next to each other in a part of the periphery of the upper surface conductor. When a short-circuit-portion through conductor 4 is composed of a plurality of through conductors, it is advantageous to effectively stabilize the ground potential by reducing the conduction resistance of the short-circuit-portion through conductor 4.

The conductor portions such as the upper surface conductor 2, the ground conductor 3, and the short-circuit-portion through conductor 4 are formed of a metal material such as tungsten, molybdenum, manganese, copper, silver, palladium, gold, platinum, nickel or cobalt. The conductor portions may be formed of alloy materials or the like containing the above-mentioned metal materials. Such metal materials and the like are disposed as conductors such as a metalized conductor or a metal plated conductor in a predetermined portion of the insulation substrate 1. The conductor includes a conductor in the shape of a layer disposed on the exposed surface of the insulation layer or disposed in between the insulation layers, and a conductor in the shape of a column filling a through hole (reference sign is not given) penetrating the insulation layer in the thickness direction.

For example, if the conductor portion is a metalized layer of tungsten, the conductor portion can be formed by printing a metal paste prepared by mixing tungsten powder with an organic solvent and an organic binder at a predetermined position of a ceramic green sheet to be an insulation substrate 1 using a screen printing method or the like, and simultaneously burning the result.

The portion penetrating the insulation substrate 1 (insulation layer) such as the short-circuit-portion through conductor 4 in the thickness direction can be formed by disposing a through hole on the ceramic green sheet in advance, and then, filling the through hole with the same metal paste and burning the result. The through hole can be disposed on the ceramic green sheet by a method such as mechanical drilling or laser processing.

When such a conductor portion is formed of a metallized layer, the exposed surface of the metallized layer may be covered with a plating layer appropriately selected from nickel, cobalt, palladium, gold, and the like and thus oxidation corrosion may be suppressed and properties such as bonding property of a bonding wire 13 described later may be improved.

As described above, FIG. 2B is a sectional view illustrating a modification example of the tag board 10 illustrated in FIGS. 1A and 1B. In FIGS. 2A and 2B, the same reference signs are given to portions similar to those in FIGS. 1A and 1B. The tag board 10 in the example illustrated in FIGS. 2A and 2B further includes a capacitive conductor 5 disposed inside the insulation substrate 1 and facing a part of the ground conductor 3 and a capacitance through conductor 6 penetrating the insulation substrate 1 in the thickness direction from the capacitive conductor 5 to the upper surface conductor 2.

When such a capacitive conductor 5 is arranged, the size of the inverted-F antenna can be reduced. That is, the tag board 10 can be made effective for reducing the size of the RFID tag 20. Since the capacitive conductor 5 faces the ground conductor 3 having no opening such as the recess 1*a*, the size thereof can be made larger, and thus, the capacitance formed between the capacitive conductor 5 and the ground conductor 3 can be made larger, which results in that the size of the tag board 10 can be further reduced.

Since the capacitive conductor 5 having the configuration described above which is electrically connected to the first electrode 11*a* is disposed in the insulation substrate 1, it is easy to extend the wiring length of the electrical connection between the feeder F and the upper surface conductor (antenna conductor) 2 and broaden the band without increasing the outer shape of the insulation substrate 1. That is, it is effective for broadening the band while keeping the size small.

Therefore, according to the tag board 10 in the present embodiment, a tag board 10 that is advantageous for manufacturing the RFID tag easy for reducing the size and broadening the band can be provided.

The capacitive conductor 5 faces the ground conductor 3 with a part of the insulation substrate 1 interposed therebetween and is electrically connected to the upper surface conductor 2 via the capacitance through conductor 6, and has a function of giving a predetermined electrostatic capacitance to the antenna conductor. The capacitive conductor 5 extends toward the center portion from an end opposite to the end portion at which the short-circuit-portion through conductor 4 is connected. At the end opposite to the end portion at which the short-circuit-portion through conductor 4 is connected, the capacitive conductor 5 is electrically connected to the upper surface conductor 2 via a capacitance through conductor 6.

It is advantageous that the area where the capacitive conductor 5 faces the ground conductor 3 is as large as possible in terms of reducing the size, but preferably the area is as small as possible in terms of high gain. Considering such points, productivity, and the economic efficiency of the RFID tag 20, the area may be set such that the capacitive conductor 5 faces the ground conductor 3 within a range of about 10 to 90% of the area of the ground conductor 3 in plan view.

The capacitive conductor 5 and the capacitance through conductor 6 can be formed in the similar way to that of the upper surface conductor 2, the ground conductor 3 and the short-circuit-portion through conductor 4.

(RFID Tag)

FIG. 3 is a sectional view illustrating an example of the RFID tag in the embodiment of the present disclosure. In FIG. 3, the same reference signs are given to elements similar to those in FIG. 1A to FIG. 2B. The RFID tag in the embodiment includes the tag board 10 having the configuration described above and the feeder F disposed in the recess 1a. As described in the explanation of the tag board 10, the feeder F includes a first electrode 11a electrically connected to the upper surface conductor 2 at a first node 14a and a second electrode 11b electrically connected to the upper surface conductor 2 at a second node 14b closer to the short-circuit-portion through conductor 4 than the first node 14a. The first electrode 11a and the second electrode 11b are electrically connected to each other by the semiconductor device 12 and the bonding wire 13.

That is, the feeder F in the RFID tag 20 in the embodiment is configured to include the first electrode 11a, the second electrode 11b, and the semiconductor device (semiconductor integrated circuit device) 12. The feeder F has a function of supplying power to the upper surface conductor 2 that functions as the antenna conductor. The semiconductor device 12 also has information management functions such as storing and reading the signals transmitted and received between the RFID tag 20 and the outside.

According to the RFID tag in an aspect of the present disclosure, since the tag board 10 having the above configuration is included, it is possible to provide the RFID tag 20 in which the possibility that the resonance frequency deviates from a predetermined range is effectively reduced.

In the RFID tag 20 in the embodiment, a through conductor 7A at an upper portion is disposed and (partially) penetrates the insulation substrate 1 in the thickness direction from the first electrode 11a to the upper surface conductor 2. The through conductor 7A is directly connected to the upper surface conductor 2 at the first node 14a. The first electrode 11a and the upper surface conductor 2 are electrically connected to each other via the through conductor 7A.

In the RFID tag 20 in the embodiment, a through conductor 7B at a lower portion is disposed and penetrates the insulation substrate 1 in the thickness direction from the second electrode 11b to the ground conductor 3. The second electrode 11b is electrically connected to the upper surface conductor 2 via the through conductor 7B at the lower portion, the ground conductor 3, and the short-circuit-portion through conductor 4. That is, the second electrode 11b is electrically connected to the upper surface conductor 2 at the second node 14b where the short-circuit-portion through conductor 4 and the upper surface conductor 2 are directly connected. Since the second node 14b is closer to the short-circuit-portion through conductor 4 than the first node 14a, the degree of freedom for matching between impedance of the semiconductor device 12 and impedance of the tag board 10 can be increased.

The first electrode 11a, the second electrode 11b, the through conductor 7A, and the through conductor 7B can also be formed in the same way as the upper surface conductor 2, the ground conductor 3, and the short-circuit-portion through conductor 4.

The semiconductor device 12 is fixed to the bottom surface of the recess 1a. The semiconductor device 12 is fixed to the bottom surface of the recess 1a by a bonding method using a bonding material such as a low melting point brazing filter material such as a gold-silicon (Au—Si) solder, a glass composite material, or a resin adhesive. In the example illustrated in FIG. 3, terminals (reference sign is not given) included in the semiconductor device 12 are electrically connected to the first electrode 11a and the second electrode 11b via the bonding wire 13. The electrical connection between the terminals of the semiconductor device 12 and the first electrode 11a and the second electrode 11b is not limited thereto, and can be connected by a flip chip connection using bumps made of metal such as solder balls or gold.

The feeder F in the recess 1a may be sealed with a sealing resin 15. When the feeder F is sealed with the sealing resin 15, the contact between the feeder F and the outside air of is suppressed, and thus, the reliability as the RFID tag 20 is improved.

The sealing resin 15 has a function of covering the semiconductor device 12 and protecting the semiconductor device 12 from, for example, moisture of the outside air or outside air such as oxygen and mechanical stress from the outside. Examples of the resin material for the sealing resin 15 include epoxy resin, polyimide resin, silicone resin, and the like. Filler particles such as silica particles or glass particles may be added to these resin materials. The filler particles are added, for example, to adjust various properties such as the mechanical strength, moisture resistance or electrical properties of the sealing resin 15. For the sealing resin 15, the material can be appropriately selected from various resin materials described above in accordance with the conditions such as workability (productivity) and economic efficiency at the time of manufacturing the RFID tag 20.

(RFID System)

As described above, an RFID system 30 in the embodiment illustrated in FIG. 4 is configured by including the RFID tag 20 having the configuration described above. The RFID system 30 in the embodiment has the RFID tag 20 having configuration described above and a reader/writer 31 including an antenna 32 for transmitting and receiving the radio waves between the reader/writer 31 and the upper surface conductor 2 of the RFID tag 20. The reader/writer 31 includes, for example, a rectangular-shaped antenna 32 on a substrate 33 made of an electrical insulation material. The substrate 33 may be a housing (not illustrated) in which the antenna 32 is disposed.

According to the RFID system in an aspect of the present disclosure, since the RFID tag having the configuration described above is included, it is possible to provide an effective RFID system in a wide band even if a distance for communicating information between the commodity and the reader/writer increases.

The commodity 40 on which the RFID tag 20 is mounted is a variety of commodities that require the use history or the like when used. Examples of the commodities include tools such as jigs or working tools used in various industrial processes such as machining, metal working, resin working, and the like. The tools also include consumable tools used for cutting, polishing, or the like. Not limited to industrial use, household daily necessities, agricultural products, various prepaid cards for transportation, medical instruments, and the like are also included in the commodity 40.

The RFID tag 20 is mounted on the commodity 40 in the form of, for example, grounding the ground conductor 3 to a metal portion of the commodity 40. By mounting in the form described above, the metal portion of the commodity 40 can also serve as a ground conductor of the antenna (the above-described inverted-F antenna or the like) of the RFID tag 20. As a result, the gain of the antenna can be improved and the communication range of the RFID tag 20 can be expanded. That is, it is possible to form the RFID system 30 that is advantageous for increasing the distance between the commodity 40 and the reader/writer for transmitting and receiving the information.

In other words, according to the RFID system 30 including the RFID tag 20 in the embodiment described above, even if the commodity 40 includes a metal portion, or the commodity 40 is made of metal such as a mold or a cutting tool like scissors, it is possible to configure the RFID system 30 that can transmit and receive the radio wave between the antenna 32 of the reader/writer 31 and the commodity 40. That is, the possibility of interference with the electromagnetic induction by the commodity (metal) can be reduced. Therefore, information (radio waves) can be transmitted and received between, for example, a plurality of metal-made commodities 40 and the reader/writer 31, and thus, the RFID system having effectively improved practicality can be obtained.

Modification Example

Figure 5:
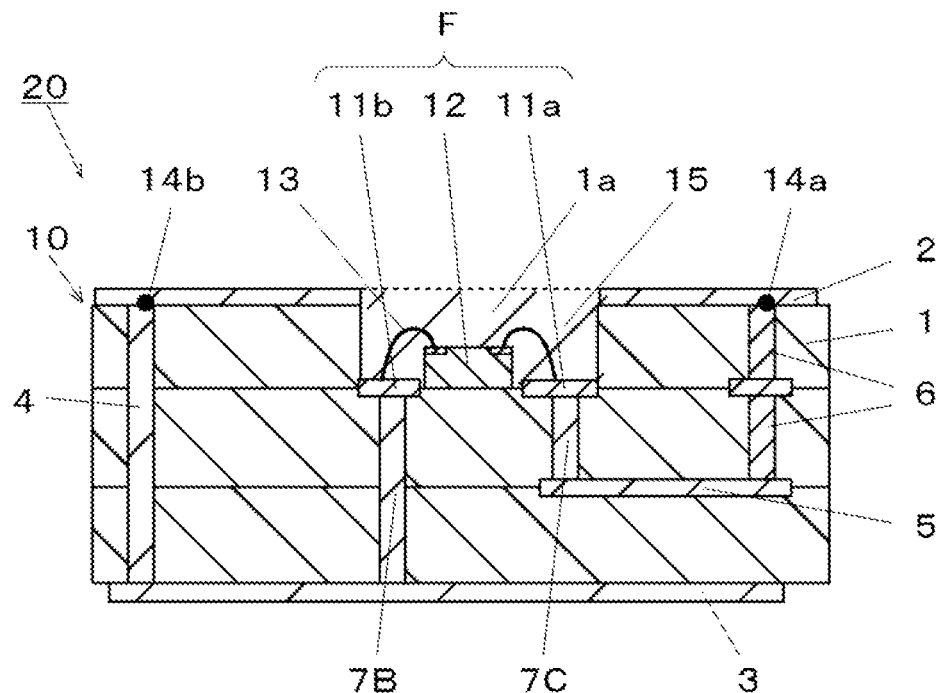
FIG. 5 is a sectional view illustrating a first modification example of the RFID tag.

FIG. 5 is a sectional view illustrating a first modification example of the RFID tag 20. In FIG. 5, the same reference signs are given to portions similar to those in FIG. 3. In the example illustrated in FIG. 5, the first electrode 11*a* is electrically connected to the upper surface conductor 2 via the capacitive conductor 5. The RFID tag 20 in this example, for example, may be the RFID tag 20 including the tag board 10 having the capacitive conductor 5 as illustrated in FIGS. 2A and 2B, and may be regarded as an example in which the first electrode 11*a* and the capacitive conductor 5 are electrically connected to each other by the through conductor 7C penetrating the insulation substrate 1 in the thickness direction in between the first electrode 11*a* and the capacitive conductor 5. The capacitive conductor 5 and the upper surface conductor 2 are electrically connected to each other by the capacitance through conductor 6. Except the points described above, the RFID tag 20 in the example illustrated in FIG. 5 is similar to the RFID tag 20 in the example illustrated in FIG. 3. Descriptions for those similar points will be omitted.

As described in the explanation of the tag board 10 having the above-described capacitive conductor 5, an inverted-F antenna in a reduced size can easily be made in the RFID tag 20 in this example. That is, the RFID tag 20 effective for reducing the size can be made.

In addition, since the capacitive conductor 5 facing the ground conductor layer 3 is disposed in the insulation substrate 1, a length of wiring, which is disposed inside and on the lower surface of the insulation substrate 1, of the electrical connection between the feeder F and the upper surface conductor (antenna conductor) 2 can effectively be increased. Therefore, the RFID tag 20 effective for reducing the size and broadening of the band can be obtained.

Therefore, according to the RFID tag 20 in this modification example, the RFID tag that is easy for reducing the size and broadening the band can be provided.

Figure 6:
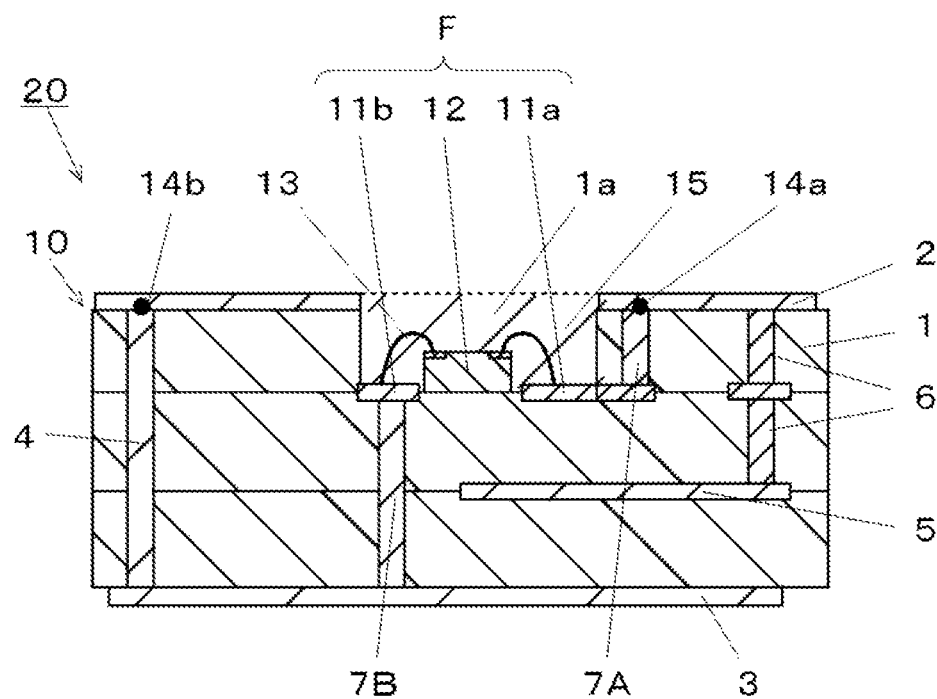
FIG. 6 is a sectional view illustrating a second modification example of the RFID tag.

FIG. 6 is a sectional view illustrating a second modification example of the RFID tag. In FIG. 6, the same reference signs are given to elements similar to those in FIG. 3. In the example illustrated in FIG. 6, the capacitive conductor 5 is arranged inside the insulation substrate 1, and the capacitive conductor 5 and the upper surface conductor 2 are electrically connected to each other by the capacitance through conductor 6, but the capacitive conductor 5 is not interposed between the first electrode 11*a* and the upper surface conductor 2. Instead, the first electrode 11*a* is electrically connected directly (that is, with a relatively short connection length) to the upper surface conductor 2 by a through conductor 7A.

In the RFID tag in this second modification example also, since the capacitive conductor 5 facing the ground conductor 3 is arranged inside the insulation substrate 1, an inverted-F antenna in a reduced size can easily be made. That is, the RFID tag 20 effective for reducing the size can be obtained. In other words, the size of the RFID tag 20 can be reduced without the capacitive conductor 5 being interposed between the first electrode 11*a* and the upper surface conductor 2.

In the RFID tag in the second modification example illustrated in FIG. 6, a length of a path from the first electrode 11*a*, the through conductor 7A, the upper surface conductor 2, the short-circuit-portion through conductor 4, the ground conductor 3, the through conductor 7B, to the second electrode 11*b* is shorter than a length of the path illustrated in FIG. 5 (the path from the first electrode 11*a* to the second electrode 11*b*), the loss between the first electrode 11*a* and the second electrode 11*b* is small, and thus, a Q value of the path can be increased. Therefore, the RFID tag 20 effective for efficiently increasing the gain can be obtained.

Therefore, according to the RFID tag 20 in the modification example, the RFID tag that is easy for reducing the size and achieving the high gain can be obtained.

In the RFID tag 20 and the tag board 20 included therein, the electrical connection between the second electrode 11*b* and the upper surface conductor 2 is not limited to the above-described example (the connection via the through conductor 7B, ground conductor 3, and short-circuit-portion through conductor 4), but may be performed in other forms. Hereinafter, examples of those other forms will be described.

Figure 7:
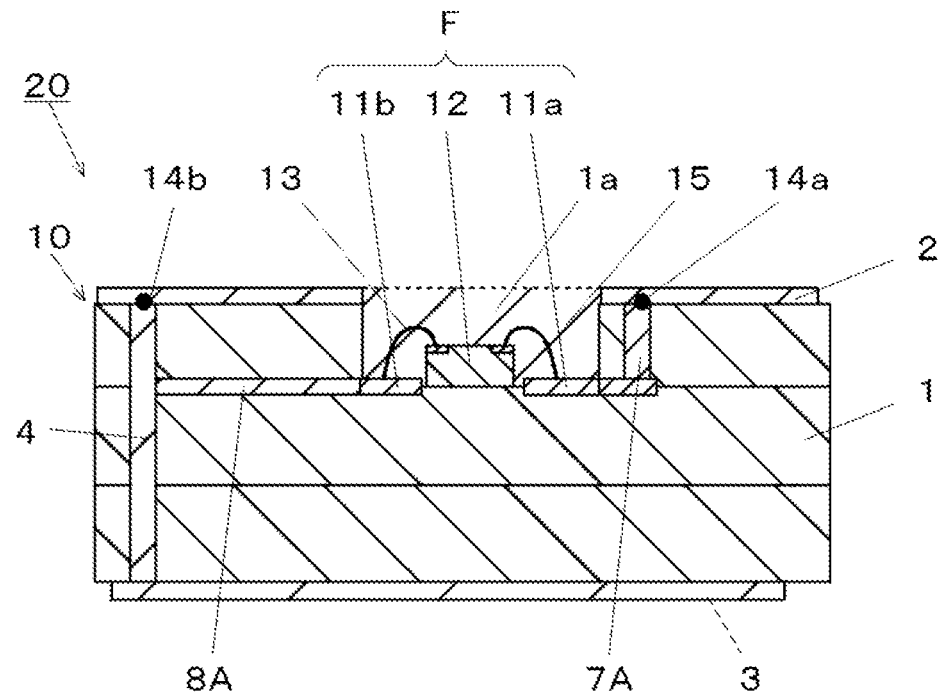
FIG. 7 is a sectional view illustrating a third modification example of the RFID tag.

FIG. 7 is a sectional view illustrating a third modification example of the RFID tag. In FIG. 7, the same reference signs are given to portions similar to those in FIG. 3. In the example illustrated in FIG. 7, an inner conductor 8A is disposed, which extends from an end portion of the second electrode lib, passes between the insulation layers, and is connected to the short-circuit-portion through conductor 4. That is, the second electrode 11*b* is electrically connected to the upper surface conductor 2 via the inner conductor 8A and the short-circuit-portion through conductor 4 (without the ground conductor 3 being interposed). The inner conductor 8A can also be regarded as an outside end portion of the second electrode 11*b* extending to the short-circuit-portion through conductor 4.

When the second electrode 11*b* is connected to the upper surface conductor 2 via the short-circuit-portion through conductor 4 as in the RFID tag in this modification example, it is advantageous in the following points. That is, in the RFID tag in the third modification example illustrated in FIG. 7, since the length of the path from the first electrode 11*a*, the through conductor 7A, the upper surface conductor 2, the short-circuit-portion through conductor 4, the inner conductor 8A, to the second electrode 11*b* is shorter than the length of the path illustrated in FIG. 5 (the path from the first electrode 11*a* to the second electrode 11*b*), the loss between the first electrode 11*a* and the second electrode 11*b* is small, and thus, it is possible to increase a Q value of the path. Therefore, the RFID tag 20 effective for efficiently increasing the gain can be obtained.

Therefore, according to the RFID tag 20 in this modification example, the RFID tag effective for obtaining a higher gain and the like can be provided.

Figure 8:
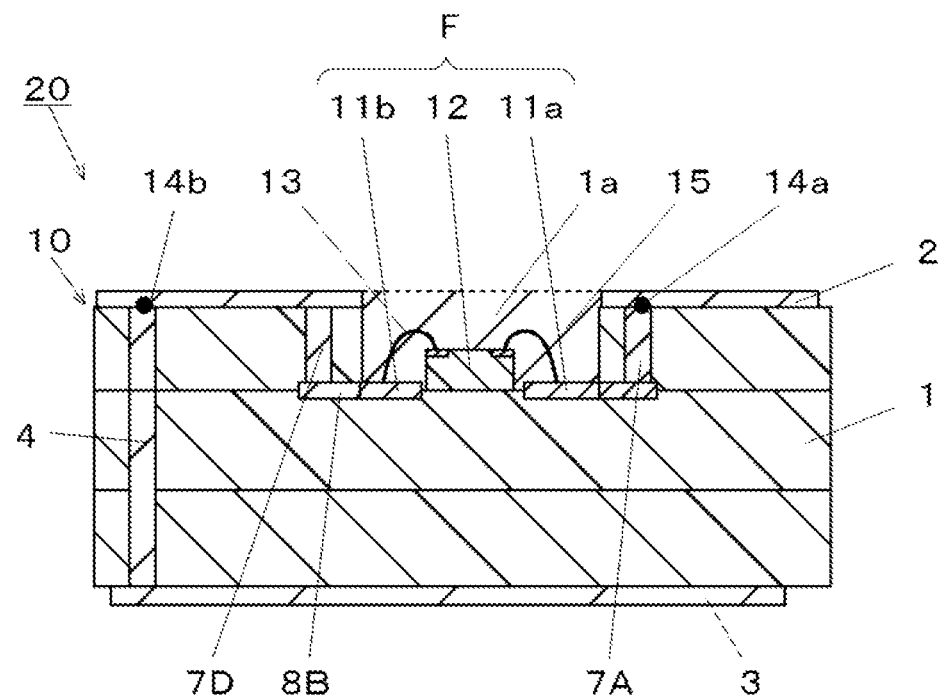
FIG. 8 is a sectional view illustrating a fourth modification example of the RFID tag.

FIG. 8 is a sectional view illustrating a fourth modification example of the RFID tag. In FIG. 8, the same reference signs are given to similar portions to those in FIG. 3. In the example illustrated in FIG. 8, an inner conductor 8B extends from the outside end portion of the second electrode 11b and passes between the insulation layers, and a through conductor 7D is arranged between the inner conductor 8B and the upper surface conductor 2. The through conductor 7D penetrates the insulation substrate 1 in the thickness direction. The inner conductor 8B can also be regarded as the outside end portion of the second electrode 11b extending between the insulation layers.

That is, in this modification example, the second electrode 11b is electrically connected to the upper surface conductor 2 without any of the ground conductor 3 and the short-circuit-portion through conductor 4 being interposed. The second node in this example is a portion where the upper end of the through conductor 7D is connected to the upper surface conductor 2.

As in the RFID tag in this modification example, when the second electrode 11b is directly connected to the upper surface conductor 2, it is advantageous in the following points. That is, in the RFID tag in the fourth modification example illustrated in FIG. 8, since the length of the path from the first electrode 11a, the through conductor 7A, the upper surface conductor 2, the through conductor 7D, the inner conductor 8B, to the second electrode 11b is shorter than the length of the path illustrated in FIG. 5 (the path from the first electrode 11a to the second electrode 11b), the loss between the first electrode 11a and the second electrode 11b is small, and thus, the Q value of the path can be increased. Therefore, the RFID tag 20 effective for efficiently increasing the gain can be obtained.

Therefore, according to the RFID tag 20 in this modification example, the RFID tag further effective for higher gain and the like can be provided.

Even in the examples illustrated in FIG. 7 and FIG. 8, the capacitive conductor 5 same as in the example illustrated in FIG. 6 can be disposed. That is, in the examples illustrated in FIG. 7 and FIG. 8, the capacitive conductor 5 may be arranged inside the insulation substrate 1, and the capacitive conductor and the upper surface conductor 2 may be electrically connected to each other by the capacitance through conductor 6. Since the first electrode 11a is electrically connected directly to the upper surface conductor 2 (that is, with a relatively short connecting length) by the through conductor 7A, the path from the first electrode 11a to the second electrode 11b is short. Therefore, the RFID tag 20 effective for efficiently increasing the gain can be obtained. By the capacitive conductor 5 being included, the RFID tag 20 effective for reducing the size can be obtained.

(Simulation Example)

Figure 9A:
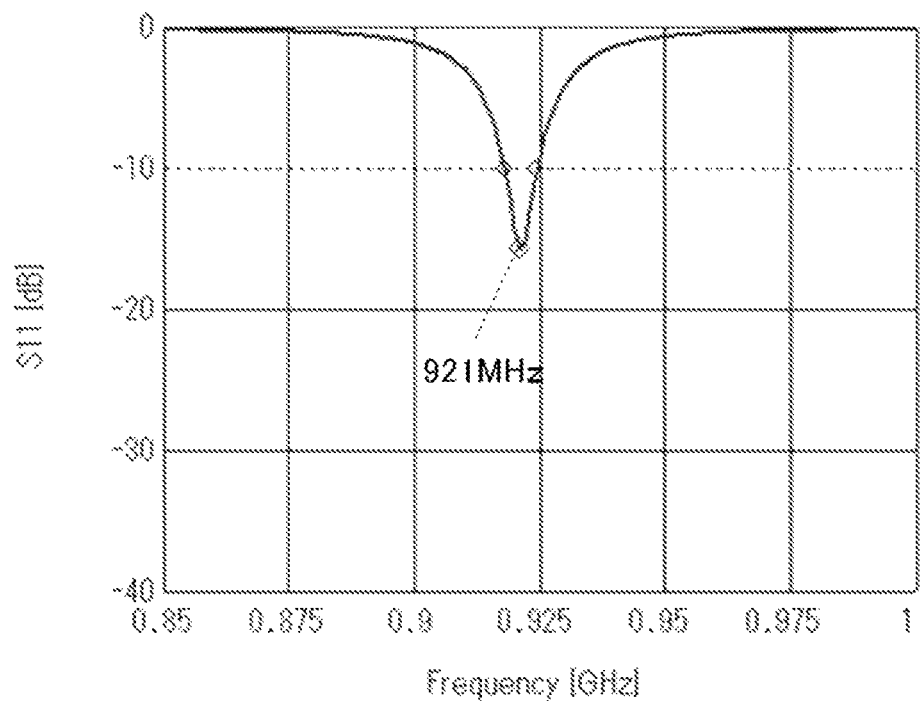
FIGS. 9A and 9B illustrate reflection characteristics of an RFID tag in a comparative example.
Figure 9B:
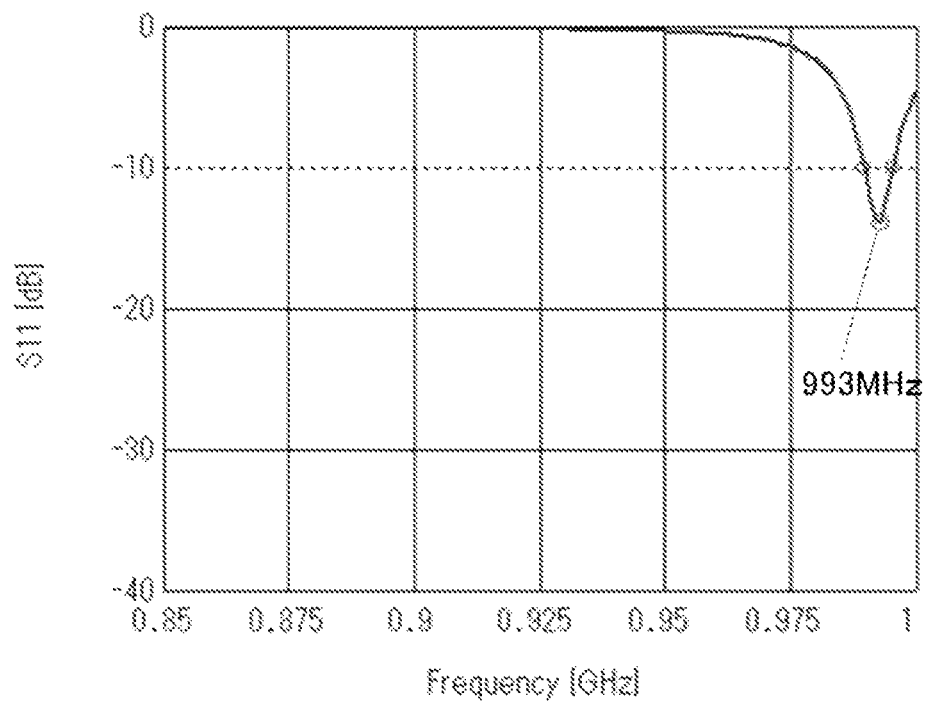
Figure 11:
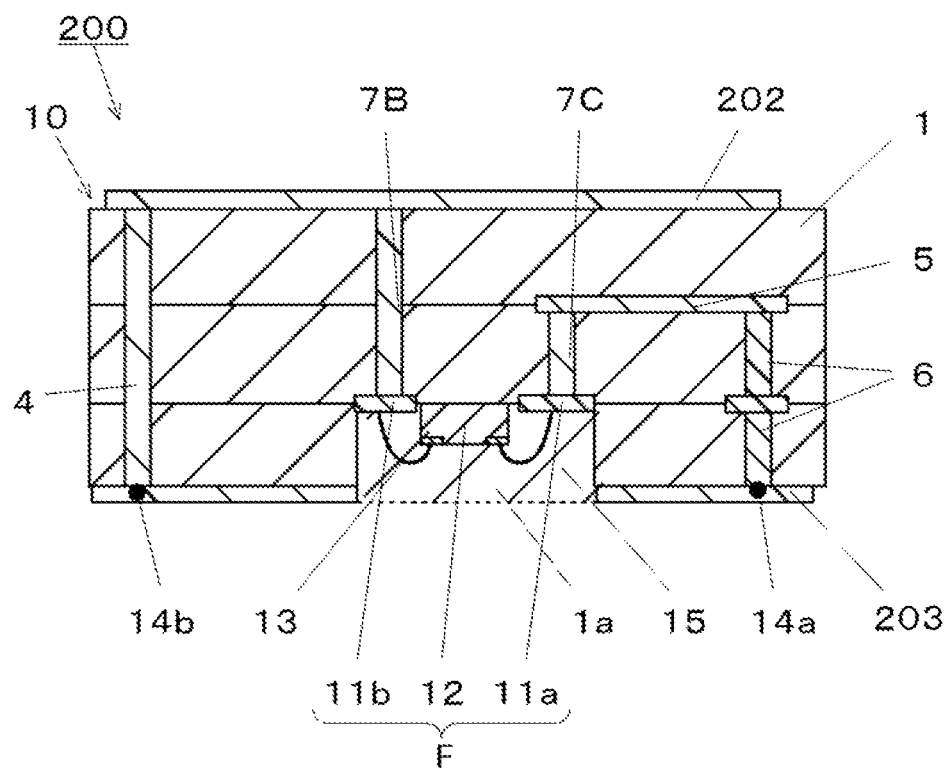
FIG. 11 is a sectional view illustrating an example of an RFID tag in the comparative example.

FIGS. 9A and 9B illustrate reflection characteristics by the electromagnetic field simulation of an RFID tag 200 illustrated in FIG. 11. FIG. 11 is a sectional view illustrating an RFID tag 200 according to a comparative example. In FIG. 11, the same reference signs are given to portions similar to those in FIG. 1A to FIG. 8. In the RFID tag 200 in the comparative example, a recess 1a is disposed on the insulation substrate 1 at a ground conductor 203 side, not at an upper surface conductor 202 side. In FIG. 9A and FIG. 9B, the horizontal axis of the graph represents the frequency and the vertical axis represents the reflection characteristics S11, and the numerical value is a resonance frequency. FIG. 9A illustrates the reflection characteristics when the ground conductor 203 side of the RFID tag 200 is installed on a copper plate with an interval of 0.3 mm, and the resonance frequency is 921 MHz. On the other hand, FIG. 9B illustrates the reflection characteristics when the ground conductor 203 side of the RFID tag 200 is installed on the copper plate without a space, and the resonance frequency is 993 MHz. That is, in the example of the RFID tag 200 illustrated in FIG. 11, when the distance between the RFID tag 200 and the copper plate is changed, the resonance frequency greatly deviates as much as 72 MHz.

Figure 10A:
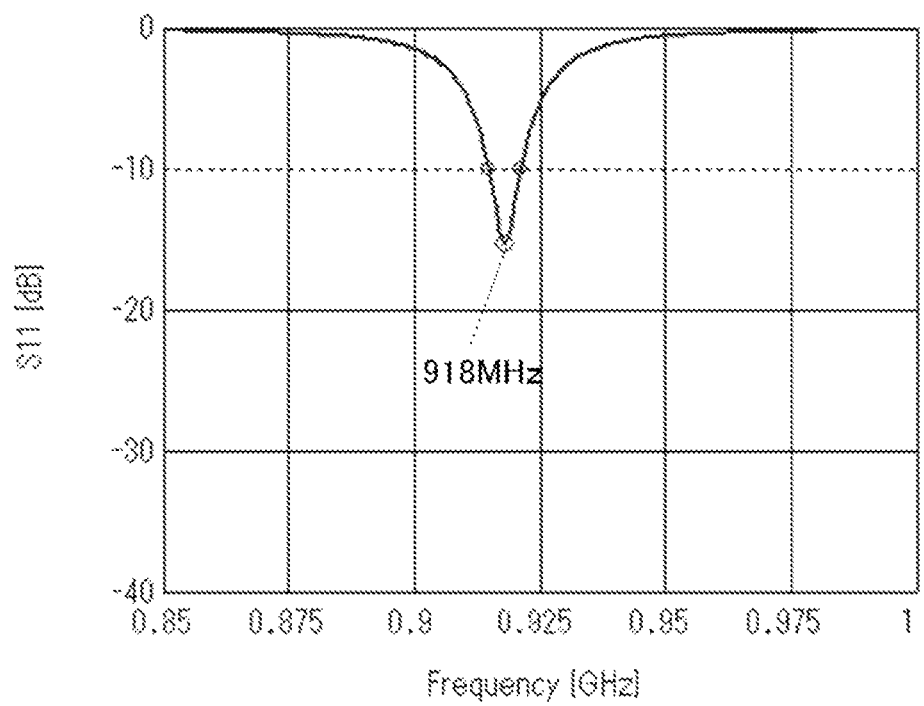
FIGS. 10A and 10B illustrate reflection characteristics of an RFID tag included in the embodiment of the present disclosure.
Figure 10B:
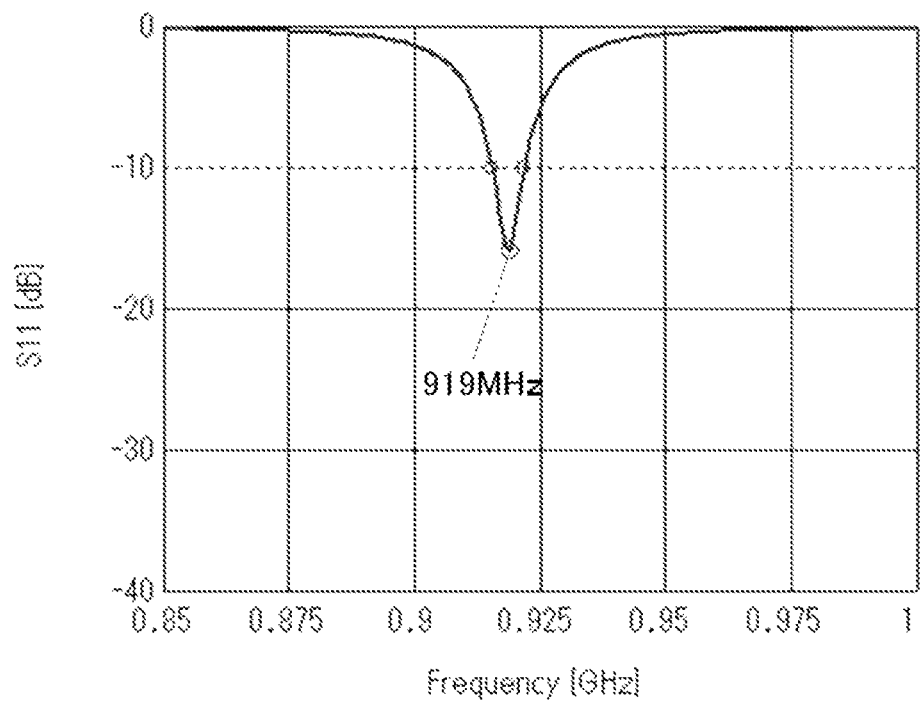

FIGS. 10A and 10B illustrate the reflection characteristics by the electromagnetic field simulation of the RFID tag 20 according to the first modification example included in the embodiment of the present disclosure illustrated in FIG. 5. In FIGS. 10A and 10B also, the horizontal axis of the graph represents the frequency and the vertical axis represents the reflection characteristics S11, and the numerical value is the resonance frequency. FIG. 10A illustrates the reflection characteristics when a ground conductor 3 side of the RFID tag 20 is installed on a copper plate with an interval of 0.3 mm, and the resonance frequency is 918 MHz. On the other hand, FIG. 10B illustrates the reflection characteristics when the ground conductor 3 side of the RFID tag 20 is installed on the copper plate without a space, and the resonance frequency is 919 MHz. That is, the resonance frequency deviates only by 1 MHz even if the distance between the RFID tag 20 in the first modification of the present disclosure illustrated in FIG. 5 and the copper plate is changed.

As described above, according to the tag board 10 and the RFID tag 20 in the embodiments of the present disclosure, the tag board 10 and the RFID tag 20 effective for suppressing the resonance frequency variation can be provided.

The present disclosure is not limited to the examples in the embodiments described above, and various modifications can be made within the scope of the gist of the present disclosure. For example, an exposed surface of the upper surface conductor 2 may be covered with a plating layer such as a gold plating layer.

In addition, not limited to the short-circuit-portion through conductor 4, a plurality of other through conductors (capacitance through conductor 6 and through conductors 7A to 7D) may be disposed side by side. That is, for example, a plurality of capacitance through conductors (not illustrated) may be disposed side by side in plan view between the capacitive conductor 5 and the upper surface conductor 2. A plurality of capacitance through conductors collectively functions similarly to one capacitance through conductor 6 in the tag board 10 or the like having the configuration described above. For example, it is possible to obtain an effect of reducing conduction resistance between the capacitive conductor 5 and the upper surface conductor 2.

REFERENCE SIGNS LIST 1 insulation substrate
1a recess
2 upper surface conductor
3 ground conductor
4 short-circuit-portion through conductor
5 capacitive conductor
6 capacitance through conductor
7A to 7D through conductor 8A and 8B inner conductor
10 tag board
F feeder
11a first electrode
11b second electrode
12 semiconductor device
14a first node
14b second node
15 sealing resin
20 RFID tag
30 RFID system
31 reader/writer
32 antenna
33 substrate
40 commodity

What is claimed is:

1. A tag board comprising:
an insulation substrate with a lower surface bonded to a commodity and an upper surface comprising a recess including a bottom surface on which a semiconductor element is disposed;
an upper surface conductor formed on the upper surface of the insulation substrate, wherein the upper surface conductor has a frame shape, continuously surrounds the recess in a plan view, and includes a first peripheral region and a second peripheral region which is opposite from the first peripheral region with respect to the recess in a plan view;
a ground conductor formed on the lower surface of the insulation substrate, where the bottom surface of the recess is located between the upper surface conductor and the ground conductor in a thickness direction of the insulation substrate;
a short-circuit-portion through conductor that penetrates the insulation substrate in the thickness direction and electrically connects the upper surface conductor and the ground conductor to each other; and
an inverted-F antenna formed from the ground conductor, an electrical connection of the short-circuit-portion through conductor to the upper surface conductor only at the first peripheral region, and the second peripheral region separated from the ground conductor, wherein the upper surface conductor transmits and receives radio waves.

2. The tag board according to claim 1, further comprising:
a capacitive conductor disposed inside the insulation substrate and facing a part of the ground conductor; and
a capacitance through conductor that penetrates the insulation substrate in the thickness direction and electrically connects the capacitive conductor and the upper surface conductor to each other.

3. An RFID tag comprising:
the tag board according to claim 1; and
a feeder in the recess, wherein
the feeder comprises
a first electrode electrically connected to the upper surface conductor at a first node, and
a second electrode electrically connected to the upper surface conductor at a second node closer to the short-circuit-portion through conductor than the first node.

4. An RFID tag comprising:
the tag board according to claim 2; and
a feeder in the recess, wherein
the feeder comprises
a first electrode electrically connected to the upper surface conductor at a first node, and
a second electrode electrically connected to the upper surface conductor at a second node closer to the short-circuit-portion through conductor than the first node.

5. The RFID tag according to claim 4, wherein
the first electrode is electrically connected to the upper surface conductor via the capacitive conductor.

6. The RFID tag according to claim 3, wherein
the first electrode and the capacitive conductor are directly connected to each other.

7. The RFID tag according to claim 4, wherein
the first electrode and the capacitive conductor are directly connected to each other.

8. An RFID system comprising:
the RFID tag according to claim 3; and
a reader/writer with an antenna for transmitting and receiving a radio wave between the reader/writer and the upper surface conductor of the RFID tag.

9. An RFID system comprising:
the RFID tag according to claim 4; and
a reader/writer with an antenna for transmitting and receiving a radio wave between the reader/writer and the upper surface conductor of the RFID tag.

10. An RFID system comprising:
the RFID tag according to claim 5; and
a reader/writer with an antenna for transmitting and receiving a radio wave between the reader/writer and the upper surface conductor of the RFID tag.

11. An RFID system comprising:
the RFID tag according to claim 6; and
a reader/writer with an antenna for transmitting and receiving a radio wave between the reader/writer and the upper surface conductor of the RFID tag.

12. An RFID system comprising:
the RFID tag according to claim 7; and
a reader/writer with an antenna for transmitting and receiving a radio wave between the reader/writer and the upper surface conductor of the RFID tag.

13. The tag board according to claim 1, wherein the upper surface conductor has a rectangular frame shape.

14. The tag board according to claim 1, further comprising:
a first electrode; and
a second electrode, wherein the first electrode and the second electrode are formed on the bottom surface of the recess and electrically connected to the semiconductor element.

* * * * *